(12) United States Patent
Nguyen et al.

(10) Patent No.: US 8,619,459 B1
(45) Date of Patent: Dec. 31, 2013

(54) HIGH OPERATING SPEED RESISTIVE RANDOM ACCESS MEMORY

(75) Inventors: Sang Nguyen, Union City, CA (US); Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/481,696

(22) Filed: May 25, 2012

Related U.S. Application Data

(60) Provisional application No. 61/500,574, filed on Jun. 23, 2011.

(51) Int. Cl.
| | | |
|---|---|---|
| G11C 11/00 | (2006.01) | |
| G11C 5/06 | (2006.01) | |
| G11C 7/00 | (2006.01) | |
| G11C 7/02 | (2006.01) | |

(52) U.S. Cl.
USPC ........ 365/148; 365/63; 365/163; 365/189.15; 365/205; 365/207

(58) Field of Classification Search
USPC ............... 365/148, 163, 63, 189.15, 205, 207
See application file for complete search history.

(56) References Cited

U.S. PATENT DOCUMENTS

| | | | |
|---|---|---|---|
| 5,499,208 A | 3/1996 | Shoji | |
| 5,673,223 A | 9/1997 | Park | |
| 5,923,587 A | 7/1999 | Choi | |
| 6,867,618 B2 | 3/2005 | Li et al. | |
| 6,897,519 B1 | 5/2005 | Dosluoglu | |
| 7,251,152 B2 | 7/2007 | Roehr | |
| 7,274,587 B2 | 9/2007 | Yasuda | |
| 7,561,461 B2 | 7/2009 | Nagai et al. | |
| 7,746,696 B1 | 6/2010 | Paak | |
| 7,764,536 B2 | 7/2010 | Luo et al. | |
| 8,054,679 B2 | 11/2011 | Nakai et al. | |
| 8,102,018 B2 | 1/2012 | Bertin et al. | |
| 8,243,542 B2 | 8/2012 | Bae et al. | |
| 8,456,892 B2 | 6/2013 | Yasuda | |
| 8,467,226 B2 | 6/2013 | Bedeschi et al. | |
| 2008/0043521 A1 | 2/2008 | Liaw et al. | |
| 2009/0251941 A1 | 10/2009 | Saito | |
| 2010/0067279 A1 | 3/2010 | Choi | |
| 2010/0102290 A1 | 4/2010 | Lu et al. | |
| 2010/0110767 A1 | 5/2010 | Katoh et al. | |
| 2010/0171086 A1 | 7/2010 | Lung et al. | |
| 2010/0182821 A1 | 7/2010 | Muraoka et al. | |
| 2011/0063888 A1 | 3/2011 | Chi et al. | |
| 2011/0066878 A1 | 3/2011 | Hosono et al. | |

(Continued)

OTHER PUBLICATIONS

Office Action for U.S. Appl. No. 12/900,232 dated Jul. 30, 2012.

(Continued)

*Primary Examiner* — Ly D Pham
(74) *Attorney, Agent, or Firm* — Ogawa P.C.

(57) ABSTRACT

Providing for resistive random access memory (RRAM) having high read speeds is described herein. By way of example, a RRAM memory can be powered at one terminal by a bitline, and connected at another terminal to a gate of a transistor having a low gate capacitance (relative to a capacitance of the bitline). With this arrangement, a signal applied at the bitline can quickly switch the transistor gate, in response to the RRAM memory being in a conductive state. A sensing circuit configured to measure the transistor can detect a change in current, voltage, etc., of the transistor and determine a state of the RRAM memory from the measurement. Moreover, this measurement can occur very quickly due to the low capacitance of the transistor gate, greatly improving the read speed of RRAM.

19 Claims, 11 Drawing Sheets

(56) References Cited

U.S. PATENT DOCUMENTS

2011/0122679 A1    5/2011   Chen et al.
2011/0205780 A1    8/2011   Yasuda et al.
2012/0074507 A1    3/2012   Jo et al.
2012/0120712 A1    5/2012   Kawai et al.

OTHER PUBLICATIONS

Notice of Allowance for U.S. Appl. No. 13/051,296 dated Aug. 31, 2012.

Notice of Allowance for U.S. Appl. No. 12/900,232 dated Sep. 18, 2012.

Office Action and List of References for U.S. Appl. No. 12/815,318 dated May 16, 2012 from the United States Patent and Trademark Office.

International Search Report for PCT/US2011/046036 filed on Jul. 29, 2011.

Written Opinion of the International Searching Authority for PCT/US2011/046036 filed on Jul. 29, 2011.

Notice of Allowability for U.S. Appl. No. 13/651,169 dated Oct. 28, 2013.

Notice of Allowance for U.S. Appl. No. 13/194,500 dated Oct. 28, 2013.

Office Action for U.S. Appl. No. 13/764,710 dated Aug. 9, 2013.

International Search Report and Written Opinion for PCT/US2013/042746 filed on May 24, 2013.

FIG. 8

| Operation | Phase | WL₀ | WL₁ | BL₀ | BL₁ | BL₂ | BL₃ | BL₄ | BL₅ | SEL₀ | SEL₁ | BL₀ | BL₁ | BL₂ | BL₃ | BL₄ | BL₅ | SL₀ | SL₁ | V$_{BIAS}$ |
|---|---|---|---|---|---|---|---|---|---|---|---|---|---|---|---|---|---|---|---|---|
| | | | | BLOCK₀ → | | | | | | | | BLOCK₁ → | | | | | | | | |
| READ | PRECHARGE | V$_{dd}$ | V$_{dd}$ | 0.5v | 0.5v | 0.5v | 0v | 0v | 0v | V$_{dd}$ | 0v | 0.5v | 0.5v | 0.5v | 0v | 0v | 0v | 0.5v | 0.5v | V$_{dd}$ |
| READ | SENSE | V$_{dd}$ | 4v | 0.5v | 0.5v | 4v | 0v | 0v | 0v | V$_{dd}$ | 0v | 0.5v | 0.5v | 4v | 0v | 0v | 0v | 4v | 0.5v | V$_{dd}$ |
| PAGE ERASE | PRECHARGE | V$_{dd}$ | 0v | 0v | 0v | 0v | 0v | 0v | 0v | V$_{dd}$ | 0v | 0v | 0v | 0v | 0v | 0v | 0v | 0v | 0v | 4v |
| PAGE ERASE | EXECUTE | V$_{dd}$ | 0v | 0v | 0v | 0v | 0v | 0v | 0v | V$_{dd}$ | 0v | 0v | 0v | 0v | 0v | 0v | 0v | 3v | 0v | 4v |
| PROGRAM | PRECHARGE | V$_{dd}$ | V$_{dd}$ | 1.5v | 1.5v | 3v | 0v | 0v | 0v | 4v | 0v | 1.5v | 1.5v | 3v | 0v | 0v | 0v | 3v | 3v | 4v |
| PROGRAM | EXECUTE | V$_{dd}$ | 0v | 1.5v | 1.5v | 3v | 0v | 0v | 0v | 4v | 0v | 1.5v | 1.5v | 3v | 0v | 0v | 0v | 0v | 3v | 4v |

800

HIGH OPERATING SPEED RESISTIVE RANDOM ACCESS MEMORY

CLAIM OF PRIORITY AND CROSS-REFERENCE TO RELATED APPLICATIONS

The subject application for patent claims priority to U.S. Provisional Patent Application Ser. No. 61/500,574 filed Aug. 6, 2011, and incorporates by reference in their respective entireties and for all purposes the following: U.S. patent application Ser. No. 11/875,541, entitled NON-VOLATILE SOLID STATE RESISTIVE SWITCHING DEVICES and filed Oct. 19, 2007, and U.S. patent application Ser. No. 12/575,921 entitled SILICON-BASED NANOSCALE RESISTIVE DEVICE WITH ADJUSTABLE RESISTANCE and filed Oct. 8, 2009.

TECHNICAL FIELD

The present application for patent relates generally to resistive random access memory technology, and more particularly to providing a resistive random access memory having a high speed for one or more memory operations.

BACKGROUND

A recent innovation within the field of integrated circuit technology is the resistive random access memory (RRAM). Much of RRAM technology is still in the theoretical stage; various electric concepts for RRAM technology exist but the concepts are in one or more stages of verification to prove or disprove the theory. Even so, RRAM technology promises to hold substantial advantages for future growth in the semiconductor electronics industry.

According to various theoretical models, the RRAM can be configured to have multiple resistive states; for instance, the RRAM can be configured to have a relatively low resistance or a relatively high resistance. Moreover, the RRAM can generally be configured to enter one or another resistive state in response to an external condition imposed upon the RRAM. Thus, in transistor parlance, applying or removing the external condition can serve to program or de-program the RRAM. Moreover, depending on physical makeup and electrical arrangement, an RRAM can generally maintain a programmed or de-programmed state. Maintaining a state might require other conditions be met (e.g., existence of a minimum operating voltage, existence of a minimum operating temperature, . . . ), or no conditions be met, depending on a makeup of the RRAM. Generally speaking, the capacity to be in one of two states and maintain one or another of the states can serve to represent one binary bit of information. Thus, RRAM is theoretically usable as electronic memory in suitably arranged electronic circuits.

Different types of RRAM structure and physiology have been suggested, with various predicted results and operating characteristics. For example, some proposed RRAM are non-volatile memory within which a conductive filament (or many filaments) can be induced within an otherwise dielectric material. In a normal state, the dielectric has high resistance, and is non-conductive. However, application of a suitable voltage across the dielectric for example, can induce a conduction path therein. Various physical mechanisms enable generation of a conduction path in a dielectric, including defects in the material (whether natural or induced via doping), metal migration, and so on. Once the filament is formed within the dielectric, the RRAM is activated—resulting in a low resistance conduction path through the dielectric. Activation of the RRAM is established by applying a program voltage across the RRAM terminals. The RRAM cell is deactivated when the filament is retracted away from at least one of the RRAM terminals or forms a discontinuous gap within the filament. The Deactivated RRAM exhibits high resistance characteristics. RRAM deactivation is established by applying an erase voltage across the RRAM terminals. Thus, the formation and retraction of a conduction path can be referred to as a programmable conduction path, yielding similar electric characteristics as a conventional three-terminal transistor. In practice, however, the inventors of the present invention believe that the RRAM has not been commercially successful for reasons including incompatibility of RRAM fabrication materials with traditional CMOS processes, the incompatibility of RRAM processes as part of back end CMOS fabrication, and the like.

Additionally, some theoretical proposals for RRAM are expected to suffer from known drawbacks of conventional memory, such as metal oxide semiconductor (MOS) transistors, and the like. For instance, conventional NAND MOS transistors often exhibit relatively poor read performance compared with other transistor technologies, as well as relatively poor cell retention. Likewise, NOR MOS transistors have relatively large cell sizes, are less scalable than other technologies, and consume higher power. While it may be a panacea to suggest that all benefits of all transistor types can be incorporated into a single technology while avoiding all detriments, significant improvements are achieved at a relatively steady pace in MOS transistor technology, and RRAM may follow a similar technology curve.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

One or more aspects of the subject disclosure provide for resistive random access memory (RRAM) having high operating speeds compared with other proposals for RRAM technology. An example of high operating speed can include a high read speed. In particular aspects, a RRAM memory can be powered at one terminal by a bitline, and connected at another terminal to a gate of a transistor having a low gate capacitance (relative to, e.g., a capacitance of the bitline). According to this arrangement, a signal applied at the bitline will quickly switch a state of the transistor gate, in response to the RRAM memory being in a conductive state. A sensing circuit configured to measure the transistor can therefore detect for a change in a suitable electrical characteristic of the transistor (e.g., current, voltage, . . . ) and determine a program state—or read—the RRAM memory from the measurement. Moreover, this measurement can occur very quickly relative to conventional RRAM that discharge the signal through the RRAM and the bitline, greatly improving the read speed of the RRAM.

In other aspects of the subject disclosure, a memory cell can comprise a set of RRAM connected to a gate of a read transistor, wherein the gate of the read transistor is also connected to a reference transistor. The reference transistor can be configured to apply a bias voltage to the gate of the read transistor, where the bias voltage is close to, but smaller than a threshold voltage of the read transistor. Accordingly, a small amount of charge from the RRAM can switch a biased gate of the read transistor, relative to an amount of charge to switch an unbiased transistor gate. Reducing the amount of charge can further improve read speeds for the RRAM. According to particular aspects of the subject disclosure, the reference transistor can be configured as a current source during read operations, mitigating effects of RRAM off current at the read transistor. In an alternative aspect, the reference transistor can be configured as a voltage source in conjunction with a non-linear resistance RRAM element.

According to additional aspects, disclosed is a memory architecture comprising a set of multiple RRAM operably connected to a gate of a read transistor for high read speed. One of a set of bitlines can be connected to respective RRAM, where powering one of the set of bitlines can facilitate operating upon one of the set of RRAM. Thus, programming, reading or erase individual RRAM can be accomplished by controlling voltages at respective ones of the set of bitlines. According to this architecture, a low profile, high RRAM density arrangement can be provided by connecting a plurality of RRAM to a single read transistor (thereby reducing a number of read transistors and associated circuitry). According to particular aspects, multiple sets of RRAM can be operably connected to the read transistor, where respective sets can be connected to or isolated from the read transistor by one or more select transistors. The arrangement comprising multiple sets of RRAM operably connected to the read transistor can be replicated along wordlines and bitlines of an electronic memory architecture, resulting in scalability of the high density arrangement.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

BRIEF DESCRIPTION OF THE DRAWINGS

FIG. 8 illustrates a diagram of an example operating table for programming, erasing and reading the semiconductor layout of FIG. 7.

DETAILED DESCRIPTION

Figure 1:
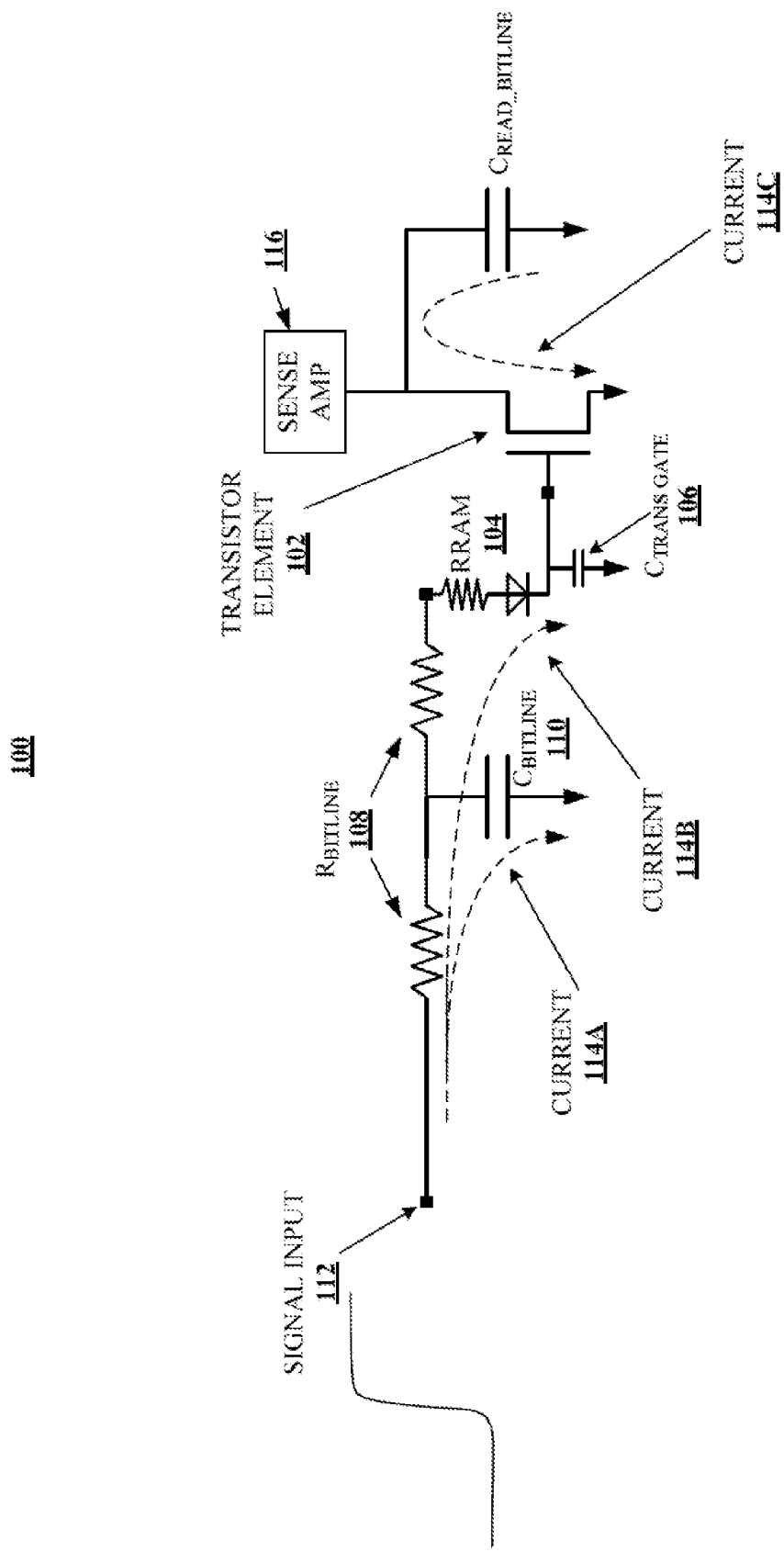
FIG. 1 illustrates a circuit diagram of an example electronic resistive random access memory (RRAM) circuit according to aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

Aspects of the subject disclosure provide for resistive random access memory (RRAM) having high operating speeds compared with conventional memory, and compared with existing proposals for RRAM technology. An example of an RRAM can include a filamentary-based RRAM, which in turn can include: a p-type silicon bearing layer (e.g., p-type polysilicon, p-type SiGe), an undoped amorphous silicon layer (i.e., having intrinsic characteristics), and an active metal layer for providing filament forming ions to the amorphous silicon layer (e.g., silver (Ag), gold (Au), nickel (Ni), aluminum (Al), chromium (Cr), iron (Fe), manganese (Mn), tungsten (W), vanadium (V), cobalt (Co), platinum (Pt), and palladium (Pd)). Some details pertaining to RRAM similar to the foregoing example can be found in the following University of Michigan U.S. patent applications that are licensed to the assignee of the present application for patent application Ser. No. 11/875,541 filed Oct. 19, 2007 and application Ser. No. 12/575,921 filed Oct. 8, 2009.

It should be appreciated that a variety of RRAM technologies exist, having different physical properties. For instance, different RRAM technologies can have different discrete programmable resistances, different associated program/erase voltages, as well as other differentiating characteristics. For instance, a unipolar RRAM, once initially programmed, can be later programmed in response to a first positive voltage (e.g., three volts) and erased in response to a second positive voltage (e.g., between four and five volts). Bipolar RRAM, on the other hand, becomes programmed in response to a positive voltage and erased in response to a negative voltage. Where no specific RRAM technology or program/erase voltage is specified for the various aspects and embodiments herein, it is intended that such aspects and embodiments incorporate any suitable RRAM technology and be operated by program/erase voltages appropriate to that RRAM technology, as would be known by one of ordinary skill in the art or made known by way of the context provided herein. It should be appreciated further that where substituting a different RRAM technology would require circuit modifications that would be known to one of ordinary skill in the art, or changes operating signal levels that would be known to one of such skill, embodiments comprising the substituted RRAM technology(ies) or signal level changes are considered within the scope of the subject disclosure.

RRAM memory cells have several advantages over conventional RAM—such as static RAM or dynamic RAM—and conventional transistors, such as metal oxide semiconductor (MOS) transistors. First, RRAM technology can generally be small, consuming silicon area on the order of $4F^2$ per adjacent RRAM device (e.g., a memory cell comprising two RRAM devices would therefore be approximately $8F^2$ if constructed in adjacent silicon space). Non-adjacent RRAM devices, e.g., stacked above or below each other, can consume as little as $4F^2$ for a set of multiple non-adjacent devices. This leads to great semiconductor component density, and low manufacturing costs for a given number of transistors. RRAM also has fast programming speed and low programming current, and smaller cell sizes enabling greater component densities. Additionally, RRAM is non-volatile memory, having the capacity to store data without continuous application of power. In addition to the foregoing, RRAM cells can generally be built between metal interconnect layers, enabling RRAM-based devices to be usable for two-dimension as well as three-dimension semiconductor architectures.

Referring now to the drawings, FIG. 1 illustrates an example electrical circuit diagram for an RRAM circuit 100 according to aspects of the subject disclosure. RRAM circuit 100 can comprise a transistor element 102 having a gate that is connected to a terminal of an RRAM 104. Transistor element 102 will generally have a relatively fast switch time, which is a time between a gate voltage exceeding a threshold voltage of transistor element 102 and conductance of the transistor element 102. In addition, transistor element 102 can be selected to have a relatively low gate capacitance 106 (e.g., by having a small channel width or channel length), thereby reducing time for charge to flow from RRAM 104 and accumulate at the gate of transistor element 102. In various aspects of the subject disclosure, transistor element 102 can comprise a variety of suitable transistors, such as a MOS transistor, including a complementary MOS, a metal oxide semiconductor field effect transistor (MOSFET), an n-channel MOSFET or NMOS transistor, a p-channel MOSFET or PMOS transistor, or the like.

RRAM 104 is depicted as a non-linear resistance device. Particularly, RRAM 104 can be depicted schematically as a combination of a resistive component (depicted by the resistor sign) and a diode component (having an arrow pointing downward). In operation, the non-linear resistance device can have linear resistance for current flowing in a first direction (downward), and a much higher resistance for current flowing in a reverse direction (upward). Essentially this implies that RRAM 104 permits current to flow in a single direction (toward the diode arrow) when RRAM 104 is activated, and generally preventing or mitigating current flow in an opposite direction (away from the arrow). However, RRAM 104 is not limited to a non-linear resistance element, and can comprise only the resistive element without the diode element in alternative embodiments of the subject disclosure.

In addition to the foregoing, RRAM 104 has properties generally associated with RRAM devices, in that RRAM has relatively high resistance when de-activated, and relatively low resistance when activated. Thus, when measured with respect to a suitable scale of current for an activated RRAM (e.g., about a hundred nanoamps or more), RRAM 104 can be said to either permit or mitigate current flow through RRAM 104, when activated or deactivated respectively. In this manner RRAM 104 can act as a transistor, being programmed when permitting current to flow (e.g., 100 nanoamps or higher) and de-programmed or erased when resisting current flow (e.g., 1 nanoamp and lower).

A bitline is connected to an opposite terminal of RRAM 104 from the terminal connected to transistor element 102. The bitline is represented by a resistance—capacitance—resistance model, or R-C-R model, comprising bitline resistance 108 and bitline capacitance 110. Generally, bitline capacitance 110 is much larger than gate capacitance 106 of transistor element 102. When a signal input 112 (e.g., voltage signal, current signal, . . . ) is set to a suitable voltage (e.g., a read voltage, . . . ) a first current 114A will flow through the bitline and a second current 114B will flow to RRAM 104. Because gate capacitance 106 of transistor element 102 has a low capacitance value (e.g., relative to bitline capacitance 110), signal input 112 can propagate through an activated RRAM 104 to the gate of transistor element 102 very quickly, toggling transistor element 102 to an activated state and enabling a transistor current 114C to flow through a channel region of transistor element 102. Transistor current 114C can be measured by a sensing amplifier 116 as an indicator of the activation or deactivation state of RRAM 104. Specifically, a change in transistor current 114C (e.g., an increase) can indicate that RRAM 104 is in an activated state, whereas a lack of change in transistor current 114C can indicate that RRAM 104 is in a de-activated state. Determining an activation/deactivation state of RRAM 104, in the parlance of a memory transistor, indicates whether RRAM 104 carries a 0 or a 1 of binary digital information.

As depicted, the read time of RRAM 104 is proportional to a switch time of transistor 102 in response to an increase in voltage or current at signal input 112. This switch time is proportional to ($R_{RRAM\_ON} * C_{TRANS\_GATE}$ 106), where $R_{RRAM\_ON}$ is the resistance of RRAM 104 when activated, and $C_{TRANS\_GATE}$ 106 is the capacitance of the gate of transistor element 102. Because the capacitance of the gate of transistor element 102 is small, the switch time of transistor element 102 is small, resulting in a small read time for RRAM 104.

Conventional proposals of RRAM arrays require the charge on the bitline (e.g., signal input 112) to discharge to a grounded RRAM device and the current amount or voltage swing on the signal input to be sensed at signal input 112. Since the RRAM resistance multiplied by bitline capacitance is large, the conventional method of sensing will be slower than the approach disclosed above in regard to RRAM circuit 100. Thus, read times for conventional RRAM arrays can be very large compared to the read time of RRAM 104. This provides a very significant advantage for RRAM circuit 100, because read time is an important characteristic of electronic memory; the faster the read time the more versatile the device. Particularly in the case of random access memory which is often utilized for application, process or thread-level communication with high speed computer processors (e.g., operating on multiple gigahertz clock speeds), read time can be a significant limitation for conventional RRAM proposals. Accordingly, the RRAM circuit of FIG. 1, as well as other embodiments disclosed herein, provides a substantial improvement to existing technology.

Figure 2:
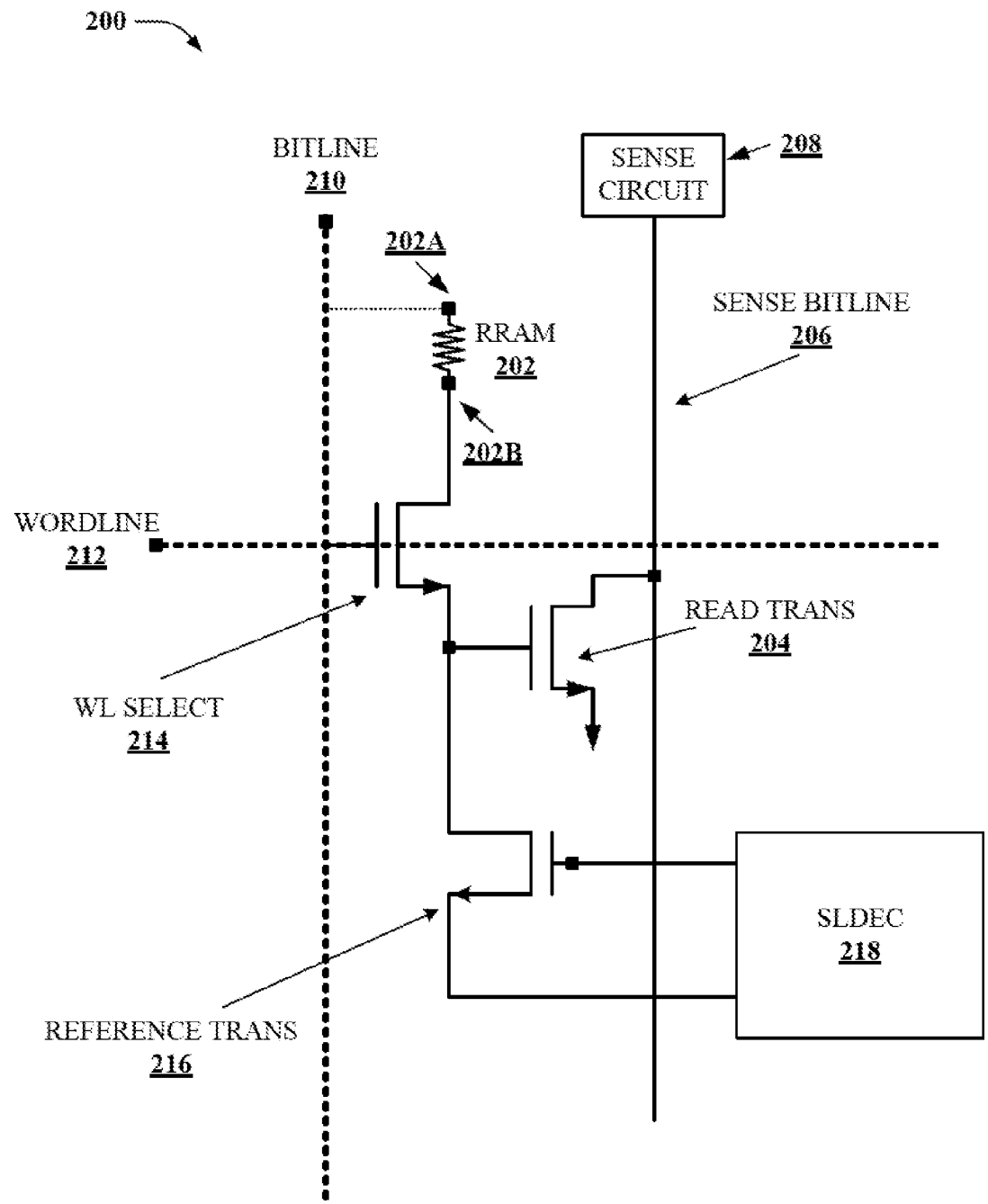
FIG. 2 depicts a diagram of a sample semiconductor layout corresponding with the circuit diagram of FIG. 1, in one or more aspects.

FIG. 2 depicts a diagram of an example layout for an electronic memory 200 according to further aspects of the subject disclosure. Electronic memory 200 can comprise a RRAM 202 connected at a first RRAM terminal 202A to a bitline 210 of electronic memory 200. Although only a single bitline 210 is depicted, it should be appreciated that electronic memory 200 can comprise many bitlines in various suitable arrangements. Additionally, respective ones of these bitlines can be connected to one or more other RRAM components, not depicted here. It should also be appreciated that, according to various other embodiments, bitline 210 and other bitlines of electronic memory 200 can be connected to multiple RRAM components. In this case, respective RRAM components can be activated or deactivated on a particular bitline by a select transistor(s), a wordline(s), or other suitable mechanism for delivering a signal to a subset of electrical components that is less than a set of such components connected to the particular bitline.

Electronic memory 200 can further comprise a read transistor 204 having a gate that can be connected or disconnected to a second RRAM terminal 202B of RRAM 202 via a wordline select transistor 214. A channel region of read transistor 204 can be connected to a sensing bitline 206. This arrangement enables a sensing circuit 208, connected to sensing bitline 206, to measure electrical characteristics of the channel region of read transistor 204. Additionally, sensing bitline 206 can be isolated from memory components (e.g., RRAM 202) of electronic memory 200, utilized for reading these memory components via one or more read transistors, but not configured to power or otherwise deliver a signal to such memory components. For instance, sensing bitline 206 can be decoupled from a stimulus source of electronic memory 200 (e.g., wherein the stimulus source is bitline 210 and a signal input applied to bitline 210). Thus, stimulus is applied at bitline 210 and sensing is applied at sensing bitline 206, in contrast for instance, to applying a stimulus and sensing on the same bitline. In at least one aspect of the subject disclosure, bitline 210 and sensing bitline 206 can have a contrary configuration, in that electronic memory 200 can power RRAM 202 and read RRAM 202 from separate bitlines dedicated at least in part to those respective functions.

In some aspects, as depicted, wordline select transistor 214 can be positioned in a path between second RRAM terminal 202B and the gate of read transistor 204. A gate of wordline select transistor 214 can be connected to a wordline 212 of electronic memory 200. This configuration enables wordline select transistor 212 to electrically connect RRAM 202 to the gate of read transistor 204 when wordline select transistor 212 is activated by a suitable signal applied at wordline 212, and enables wordline select transistor 212 to electrically isolate RRAM 202 from the gate of read transistor 204 when wordline select transistor 212 is deactivated (e.g., by lack of the suitable signal applied at wordline 212). As depicted, RRAM 202, read transistor 204, bitline 210 and wordline select transistor 214 are configured such that activation of wordline select transistor 212 can cause a signal applied to bitline 210 to propagate to the gate of read transistor 204, in the event that RRAM 202 is activated. A resulting voltage applied at the gate of read transistor 204 in response to this signal can switch read transistor 204 to a conductive state, if the voltage exceeds a threshold voltage of read transistor 204. Therefore, because toggling of read transistor 204 is dependent on the activation/deactivation state of RRAM 202, a program or erase state of RRAM 202 can be determined by sensing circuit 208 from an electrical characteristic(s) of read transistor 204 exhibited at sensing bitline 206.

According to further aspects of the subject disclosure, electronic memory 200 can comprise a reference transistor 216 connected to the gate of read transistor 204. Reference transistor 216 can be configured to apply a bias voltage to the gate of read transistor 204. This bias voltage can be set to a level that is close to, but less than, the threshold voltage of read transistor 204. As an example, if the threshold voltage of read transistor 204 is 0.6 volts, the bias voltage can be pre-charged to 0.5 volts, or a similar voltage level. Thus, the bias voltage brings the gate of read transistor 204 close to the threshold voltage, so that a small amount of charge propagating from RRAM 202 (e.g., causing about a hundred millivolt increase to the gate voltage in the example above) can switch or activate read transistor 204. By reducing an amount of charge required to be delivered to the gate of read transistor 204 by RRAM 202, a response time of read transistor 204 can be further reduced. Operation of reference transistor 216, which acts as a current source path during a read operation, can be controlled by source line decoder (SLDEC) 218. As one example, SLDEC 218 can set a current value of reference transistor 216 acting as a current source, large enough to obviate any off current that might flow through RRAM 202 when RRAM 202 is deactivated. SLDEC 218 can activate or deactivate reference transistor 216 by controlling a gate voltage of reference transistor 216, and can set the bias voltage by applying a voltage level to a channel region of reference transistor 216.

Figure 3:
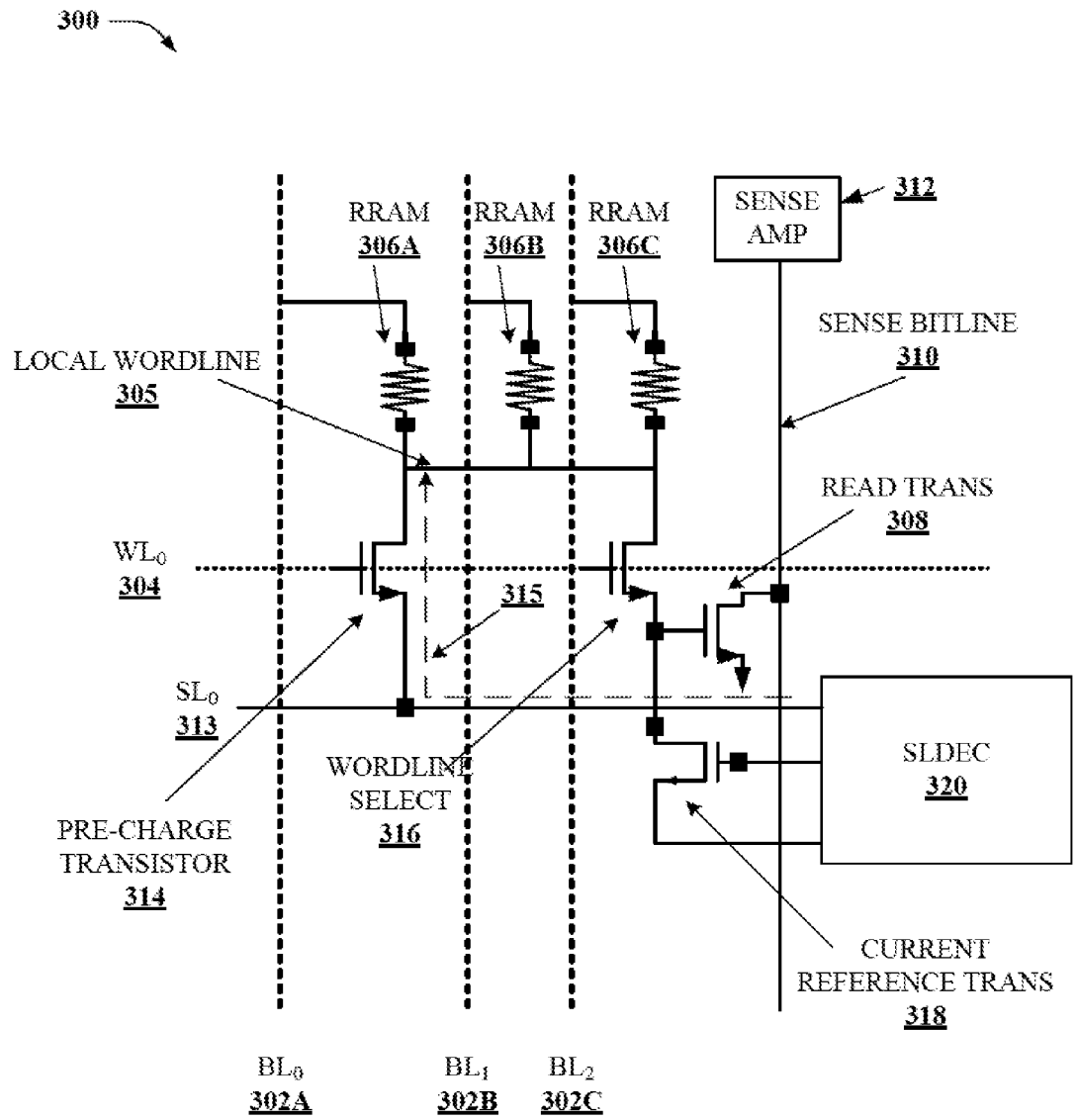
FIG. 3 illustrates a block diagram of an example semiconductor layout having a plurality of RRAM operably connected to a read transistor in particular aspects.

FIG. 3 illustrates a diagram of an example electronic memory 300 connecting a plurality of RRAM devices to a read transistor, according to further aspects of the subject disclosure. Electronic memory 300 can comprise a set of bitlines, including bitline$_0$ (BL$_0$) 302A, bitline$_1$ (BL$_1$) 302B and bitline$_2$ (BL$_2$) 302C (referred to collectively as bitlines 302A-302C), and a wordline(s) 304 generally transverse to bitlines 302A-302C. In addition, electronic memory 300 can comprise a set of RRAM including RRAM 306A, RRAM 306B and RRAM 306C (referred to collectively as RRAM 306A-306C). Each of RRAM 306A-306C are connected at respective first terminals to a respective one of bitlines 302A-302C, as depicted. RRAM 306A-306C can be programmed, erased or read by a suitable program, erase or read voltage applied at one of respective bitlines 302A-302C that propagates to the respective first terminals of RRAM 302A-302C.

A second terminal of respective RRAM 306A-306C are connected at a local wordline 305. Local wordline 305 in turn can be connected to a wordline select transistor 316, and a pre-charge transistor 314, each of which can be activated by wordline 304. When activated, wordline select transistor 316 electrically connects local wordline 305 and therefore the second terminals of RRAM 306A-306C to a gate of a read transistor 308. Likewise, when deactivated, read select transistor 316 electrically isolates the second terminals of RRAM 306A-306C to the gate of read transistor 308. As discussed in more detail below, wordline 305 activates and deactivates pre-charge transistor 314 as well, facilitating applying a pre-charge current at local wordline 305 according to some aspects of the subject disclosure. In other aspects, pre-charging can be facilitated through current reference transistor 318 and wordline select transistor 316 (e.g., see FIG. 4, infra).

Upon activation of wordline select transistor 314 by wordline 304, a selected RRAM 306A-306C can be operated by applying a suitable operation voltage (e.g., read voltage, program voltage, erase voltage, . . . ) to a corresponding one of bitlines 302A-302C. Operation of non-selected RRAM 306A-306C can be prohibited by not applying the operation voltage to the corresponding bitlines 302A-302C connected to the non-selected RRAM 306A-306C. Alternatively, non-selected RRAM 306A-306C can be prohibited from operation by applying a prohibition voltage to associated bitlines 302A-302C, allowing the associated bitlines 302A-302C to float (no applied voltage), or the like, or a suitable combination thereof. Thus, to read RRAM 306B and prohibit reading of RRAM 306A and RRAM 306C, a suitable activation signal can be applied at wordline 304 to activate wordline select transistor 316, and a suitable read voltage can be applied to bitline 302B. In addition, a prohibit voltage (e.g., a low voltage, an opposite polarity voltage from the read voltage, . . . ) can be applied to bitlines 302A and 302C. If active, current can flow through RRAM 306B to a gate of read transistor 308, which in turn can change an electrical characteristic (e.g., current, voltage, . . . ) at a sensing bitline 310, which can be detected by a sensing amplifier 312.

Additionally, a reference transistor 318 can pre-charge the gate of read transistor 308 with a bias voltage, as described at FIG. 2, supra, improving response times of read transistor 308. Further, reference transistor 318 can be operated as a current source by an SLDEC 320 for read operations. A current value of the current source can be selected by SLDEC 320 based on the RRAM 306A-306C and signal input applied at bitlines 302A-302C. More particularly, the current value of the current source can be selected to obviate an off current anticipated for deprogrammed or deactivated RRAM 306A-306C (e.g., where an off current is about 1 nanoamp, the current source can be operated at about 10 nanoamps, or another suitable level for obviating off current effects of RRAM 306A-306C on the gate of read transistor 308).

By aggregating multiple RRAM 306A-306C with a single read transistor 308, electronic memory 300 can achieve a higher component density. For instance, electronic memory 200 of FIG. 2 comprises a single RRAM connected to a single read transistor. In this arrangement, a read transistor could be used for each RRAM. By connecting multiple RRAM to a single read transistor, however, electronic memory 300 can have the improved component density relative to electronic memory 200.

According to a particular aspect of the subject disclosure, a pre-charge path 315 can facilitate application of a pre-charge signal to local wordline 305. The pre-charge signal can enable, for instance, mitigation of leakage current among the RRAM 306A-306C or among the bitlines 302A-302C. Because each of the RRAM 306A-306C have their second terminals connected at local wordline 305, a voltage difference at respective RRAM 306A-306C can result in a leakage current from one bitline to another, resulting in cross-talk or potential errors. SLDEC 320 can be configured to pre-charge local wordline 305 through a source line 313 and pre-charge transistor 314, to apply a pre-charge voltage configured to counter-balance the leakage current. For instance, a pre-charge voltage might be equal in magnitude to a voltage difference between one or more RRAM 306A-306C, to mitigate a voltage drop across one or more of RRAM 306A-306C prior to or concurrent with a related operation pertaining to one or more of RRAM 306A-306C (e.g., read operation, program operation, erase operation, . . . ). As an example of suitable voltages for pre-charging, see FIGS. 7 and 8, infra.

Figure 4:
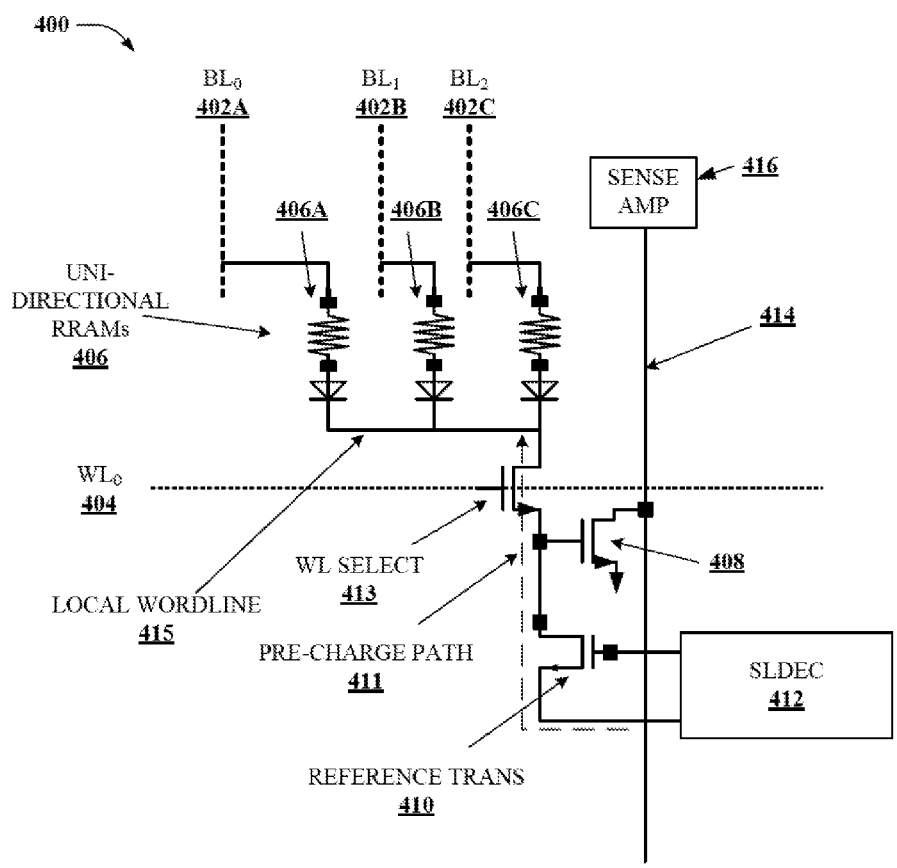
FIG. 4 depicts a block diagram of a sample semiconductor layout having a plurality of non-linear resistance RRAM coupled to the read transistor of FIG. 3.

FIG. 4 illustrates a diagram of an example electronic memory 400 according to alternative or additional aspects of the subject disclosure. Electronic memory 400 can comprise a set of bitlines, including $BL_0$ 402A, $BL_1$ 402B and $BL_2$ 402C (referred to collectively as bitlines 402A-402C), and one or more wordlines 404. A first terminal of a set of RRAM can be connected to respective ones of bitlines 402A-402C, including RRAM 406A, RRAM 406B and RRAM 406C (referred to collectively as RRAM 406A-406C). Note that RRAM 406A-406C can be non-linear resistance RRAM, permitting current flow under normal operating conditions (e.g., a typical read voltage) in a single direction. The non-linear resistance RRAM are depicted in FIG. 4 by the combination of a resistive component and a diode component, in which the diode component allows current to flow downward, toward a gate of a read transistor 408. In other words, non-linear resistance as referred to herein, indicates that the RRAM will permit current to flow in a single direction during a read operation, and will not permit current to flow or resist current flow in an opposite direction during the read operation.

In addition to the foregoing, electronic memory 400 can comprise a reference transistor 410 and a SLDEC 412. Reference transistor 410 and SLDEC 412 can operate as a current source in at least one disclosed aspect. In this arrangement, reference transistor 410 and SLDEC 412 can apply a bias voltage to the gate of reference transistor 408 without driving the gate voltage of reference transistor 408 to a particular value. By choosing the bias voltage properly, reference transistor 410 and SLDEC 412 can improve switching times of read transistor 408, as described herein.

In addition, SLDEC 412, reference transistor 410 and a wordline select transistor 413 can provide a pre-charge path 411 for a local wordline 415 connected to RRAM 406A-406C. As described herein, the pre-charge path can be utilized to apply a suitable pre-charge signal to local wordline 415. This pre-charge signal can be utilized to further mitigate or avoid current leakage between bitlines 402A-402C. Note that pre-charge path 411 can be employed with linear resistance RRAM as well (e.g., RRAM 306A-306C of FIG. 3, supra). Thus, non-linear resistance RRAM and pre-charge path 411 can be implemented separately, or in conjunction, or not at all (per FIG. 3, as one example).

Respective RRAM 406A-406C can be operated by applying a suitable activation voltage at wordline 404, and by applying a suitable operation voltage (e.g., read voltage, program voltage, erase voltage, . . . ) at one of bitlines 402A-402C. Non-selected RRAM 406A-406C can be prohibited from operating by application of a prohibition voltage, zero volts, no voltage source (e.g., floating), or the like. For a read operation, as an example, a read voltage applied at one of bitlines 402A-402C can cause a current to flow through a corresponding one of RRAM 406A-406C, if the corresponding RRAM is activated. This current can switch a state of read transistor 408, enabling a current to flow from a sense amplifier 416 through a sensing bitline 414. Current flowing through sensing bitline 414 can be indicative of the activated state of the corresponding RRAM, whereas lack of current flowing through sensing bitline 414 can be indicative of a deactivated data of corresponding RRAM, facilitating reading the state of the corresponding RRAM.

Figure 5:
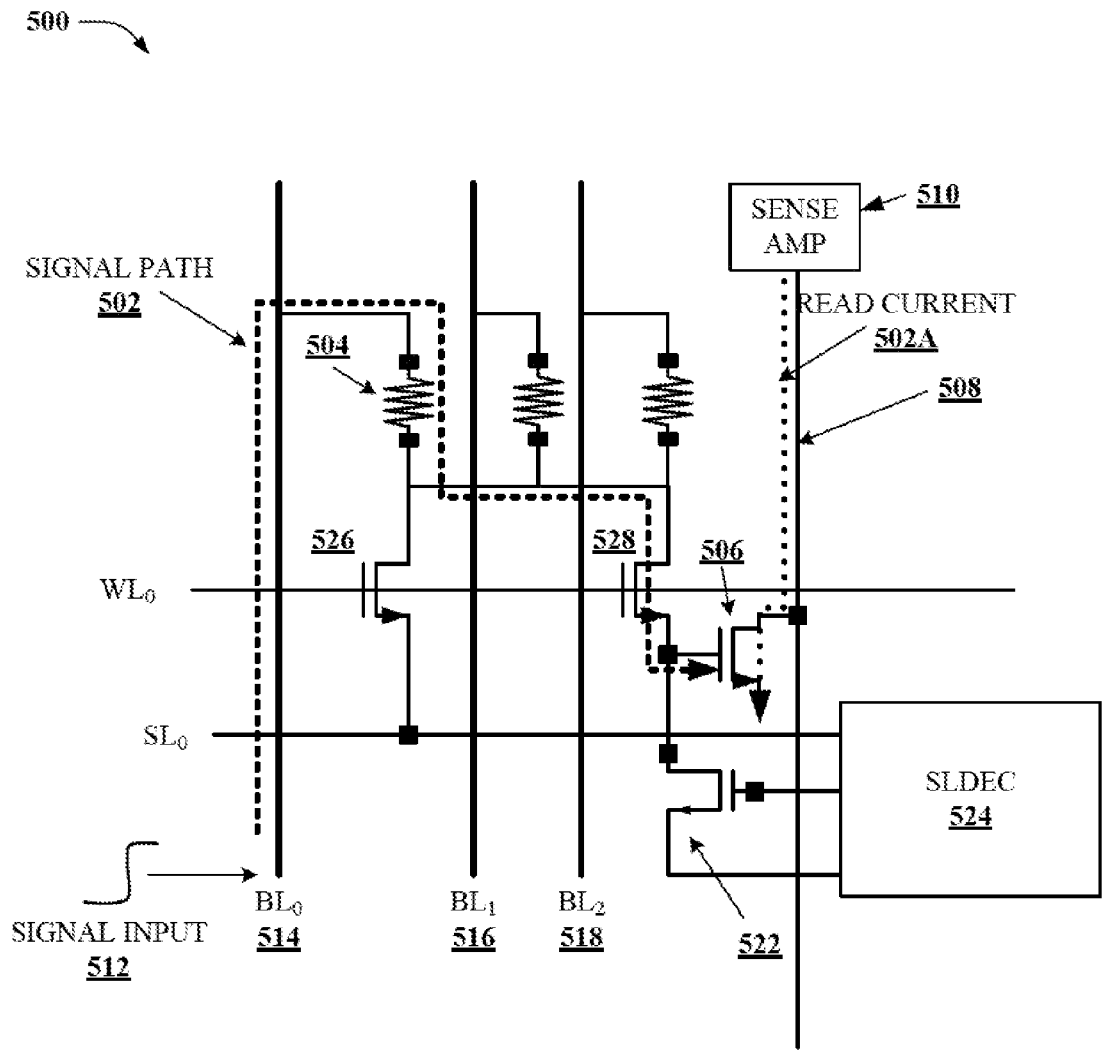
FIG. 5 illustrates a block diagram of an example current path for a semiconductor layout according to various aspects of the subject disclosure.

FIG. 5 illustrates a diagram of an example electronic memory 500 including a signal path 502 for a read operation of high speed RRAM, according to aspects of the subject disclosure. Signal path 502 is depicted as a dashed line originating from a signal input 512 applied at a first bitline $BL_0$ 514 of a set of bitlines, which includes $BL_0$ 514, $BL_1$ 516 and $BL_2$ 518 (referred to collectively as bitlines 514-518). Current flowing along signal path 502 encounters an RRAM 504 connected to $BL_0$ 514. If RRAM 504 is activated, current flows through RRAM 504 to a gate of a read transistor 506, toggling read transistor 506 and resulting in a read current 502A at a sensing bitline 508 of electronic memory 500, which can be detected by a sensing amplifier 510. Read current 502A is indicated by a dotted line traveling from sensing amplifier 510 through read transistor 506 to ground.

In the event that RRAM 504 is deactivated, current is resisted along signal path 502 at RRAM 504. Additionally, reference transistor 522 is operated as a current source, sinking a current at the gate of read transistor 506 to a value that exceeds an off current that manages to flow at RRAM 504. Accordingly, read transistor 506 does not switch state and read current 502A does not flow through sensing bitline 508. Lack of the read current 502A is indicative of RRAM 504 being in a deactivated state.

Electronic memory 500 can be substantially similar to other electronic memory disclosed herein. For instance, in one aspect, RRAM 504 can be a linear resistance device similar to RRAM 306A-306C, and a reference transistor 522 and SLDEC can pre-charge a common wordline connected to respective terminals of multiple RRAM 306A-306C, mitigating cross-bitline current leakage at the common wordline. In another aspect, RRAM 504 can comprise a non-linear resistance device similar to RRAM 406A-406C of FIG. 4, supra. In such case, non-selected RRAM 406A-406C can be prohibited from operating by application of a prohibition voltage, or zero volts, or by floating bitlines of non-selected RRAM 406A-406C, due to the anti-current leakage properties of the non-linear resistance RRAM 406A-406C. Combinations of the foregoing or similar aspects of the subject disclosure can also be implemented.

Although not depicted, electronic memory 500 can have one of multiple pre-charge paths for pre-charging RRAM 504 in conjunction with (e.g., prior to) applying signal input 512. A suitable pre-charge path can be facilitated by a source line, $SL_0$ connected to SLDEC 524, and a pre-charge transistor 526 activated by $WL_0$ and connected to RRAM 504. Alternatively, the pre-charge path can be facilitated by reference transistor 522 in conjunction with a wordline select transistor 528 connected to RRAM 504. In the first case, a pre-charge path provides current flow from SLDEC 524 through $SL_0$ and pre-charge transistor 526. In the latter case, the pre-charge path provides current flow from SLDEC 524, through reference transistor 522 and wordline select transistor 528 (e.g., see FIGS. 3 and 4, respectively).

Figure 6:
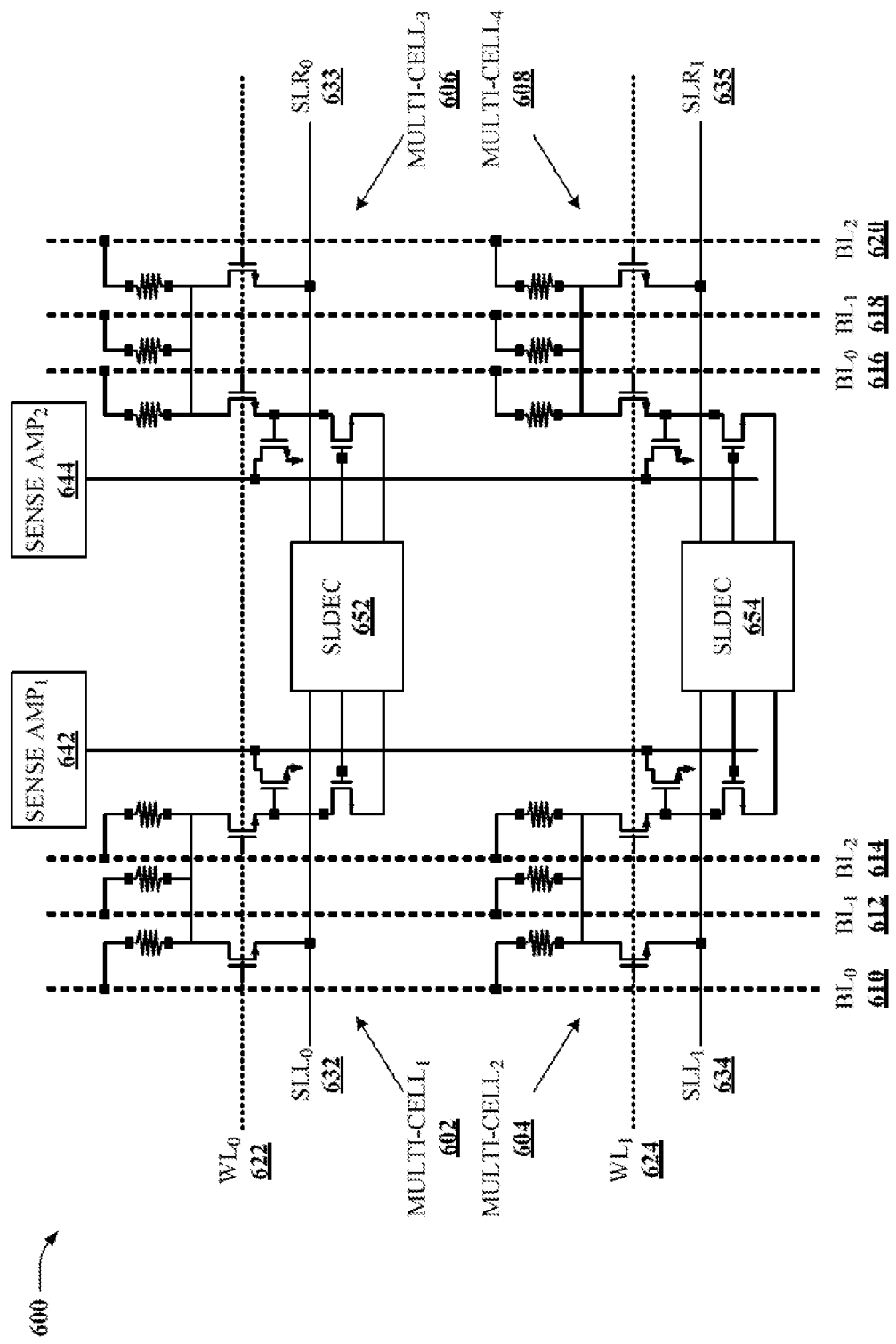
FIG. 6 illustrates a diagram of an example semiconductor layout for a four by four block of RRAM according to further aspects of the subject disclosure.

FIG. 6 depicts a diagram of an example electronic memory 600 according to still other aspects of the subject disclosure. Electronic memory 600 comprises four multi-cell memory sectors organized in respective quadrants of electronic memory 600. Particularly, the multi-cell memory sectors include multi-cell$_1$ 602 at an upper right quadrant of electronic memory 600, multi-cell$_2$ 604 at a lower left quadrant of electronic memory 600, multi-cell$_3$ 606 at an upper right quadrant of electronic memory 600, and multi-cell$_4$ 608 at a lower right quadrant of electronic memory 600, referred to collectively as multi-cells 602-608. A set of bitlines are depicted, including a first subset of bitlines $BL_0$ 610, $BL_1$ 612 and $BL_2$ 614 traversing the upper left and lower left quadrants, and a second subset of bitlines $BL_0$ 616, $BL_1$ 618, and $BL_2$ 620 traversing the upper right and lower right quadrants, respectively. The first subset of bitlines are referred to collectively as first subset of bitlines 610-614, whereas the second subset of bitlines are referred to collectively as second subset of bitlines 616-620. Furthermore, electronic memory 600 comprises a wordline $WL_0$ 622 traversing the upper left and upper right quadrants, and a wordline $WL_1$ 624 traversing the lower left and lower right quadrants of electronic memory 600.

Respective multi-cells 602-608 comprise a set of RRAM devices connected respectively to one of the set of bitlines. RRAM devices of a particular one of multi-cells 602-608 can be operated by activating one of wordlines $WL_0$ 622 or $WL_1$ 624 and applying an operating signal to a bitline of either the first subset of bitlines 610-614 or the second set of bitlines 616-620. Thus, for instance, to read the middle RRAM of multi-cell$_4$ 608, $WL_1$ 624 can be activated in conjunction with applying a read voltage to $BL_1$ 618. It should be appreciated that RRAM devices of electronic memory 600 can comprise linear resistance devices, non-linear resistance devices, unipolar devices or bi-polar devices, in various alternative or additional embodiments. Suitable changes in read, write or program operations can be implemented for respective types of RRAM devices as well, without departing from the scope of the subject disclosure.

Pre-charging can be accomplished utilizing a pre-charge path comprising a left-side source line, $SLL_0$ 632 or $SLL_1$ 634, and associated pre-charge transistor (e.g., see pre-charge transistor 314 of FIG. 3, supra) for multi-cells 602 and 604. Likewise, for multi-cells 606 and 608, a right-side source line, $SLR_0$ 633 or $SLR_1$ 635 can be activated along with a pre-charge transistor associated with these cells. As depicted, the pre-charge transistor(s) are activated by $WL_0$ 622 or $WL_1$ 624.

Respective ones of a pair of sense amplifiers 642, 644 can be connected to multi-cells 602, 604 and multi-cells 606, 608, respectively, for determining a state of RRAM devices of the left quadrant multi-cells 602, 604 or right quadrant multi-cells 606, 608, respectively. Note that a single sensing bitline can be utilized by respective sense amplifiers 642, 644 to determine RRAM device states for a plurality of multi-cells 602-608. Particularly, sensing amplifier$_1$ 642 is connected to respective read transistors of multi-cell$_1$ 602 and multi-cell$_2$ 604 by a common sensing bitline. Likewise, sensing amplifier$_2$ 644 is connected to respective read transistors of multi-cell$_3$ 606 and multi-cell$_4$ 608 by a common sensing bitline. Also depicted are a set of SLDECs, including SLDEC 652 for controlling bias voltages at multi-cell$_1$ 602 and multi-cell$_3$ 606, and SLDEC 654 for controlling bias voltage at multi-cell$_2$ 604 and multi-cell$_4$ 608. SLDECs 652 and 654 are also configured for setting and applying pre-charge voltages for multi-cells 602-608. Particularly, SLDEC 652 can be configured to apply a pre-charge signal to multi-cell 606 along $SLR_0$ 633, and to apply a pre-charge signal to multi-cell 602 via $SLL_0$ 632, and similarly SLDEC can apply the pre-charge signal to multi-cell 604 at $SLL_1$ 634 and to multi-cell 608 at $SLR_1$ 635.

Figure 7:
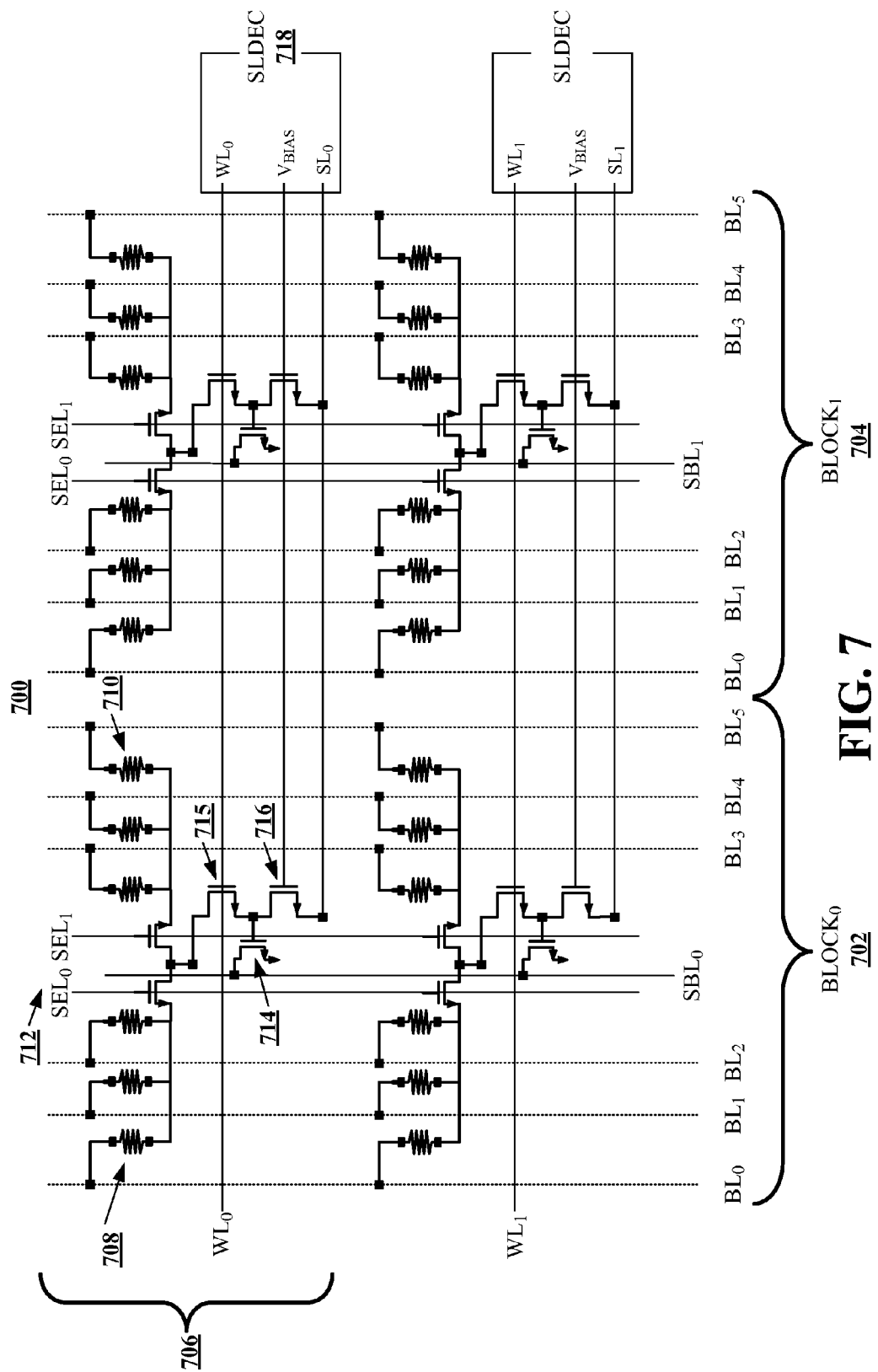
FIG. 7 depicts a diagram of a sample semiconductor layout according to still other aspects of the subject disclosure.

FIG. 7 illustrates a circuit diagram of an example electronic memory 700 according to still other aspects of the subject disclosure. Electronic memory 700 is organized into two blocks of memory cells, including block$_0$ 702 and block$_1$ 704 (referred to collectively as memory blocks 702, 704). Memory blocks 702, 704 comprise respective sets of bitlines as well as two wordlines, $WL_0$ and $WL_1$. It should be appreciated that although electronic memory 700 depicts only two wordlines, a similar architecture to electronic memory 700 can have additional wordlines, above $WL_0$ or below $WL_1$, and likewise a similar architecture to electronic memory 700 can include additional memory blocks to the left of block$_0$ 702 or to the right of block$_1$ 704. In at least one aspect of the subject disclosure, electronic memory 700 can be replicated in a third dimension above or below the page of FIG. 7, for instance.

Electronic memory 700 comprises similar components within block$_0$ 702 and block$_1$ 702, and along wordlines $WL_0$ and $WL_1$. Accordingly, the discussion below focuses on an upper segment 706 of block$_0$ 702. However, the discussion is equally applicable to the lower segment of block$_0$ 702, or the upper or lower segments of block$_1$ 704.

Upper segment 706 of block$_0$ 702 comprises multiple sets of RRAM 708, 710, wherein each set of RRAM 708, 710 comprises a plurality of RRAM devices. Respective RRAM devices are connected at one terminal thereof to respective bitlines of block$_0$ 702. By applying an operating signal to one of these bitlines, respective RRAM devices of sets of RRAM 708, 710 can be respectively operated. For read operations, a pair of select lines 712, including $SEL_0$ and $SEL_1$, facilitate connecting either set of RRAM 708 or set of RRAM 710 to a sensing and pre-charge circuit. The sensing and pre-charge circuit comprises a wordline select transistor 715, a read transistor 714, and a reference transistor 716. The circuit is activated in response to $WL_0$ activating wordline select transistor 715, causing either set of RRAM 708 or set of RRAM 710 to be connected to a gate of read transistor 714. Further, pre-charging is activated by an SLDEC 718 activating reference transistor 716. In this context pre-charging can include pre-charging a local wordline associated with set of RRAM 708 or set of RRAM 710 (e.g., through a pre-charge path comprising reference transistor 716 and wordline select transistor 715), and can include applying a bias voltage to the gate of read transistor 714, or both functions. Pre-charging can mitigate or avoid leakage current among bitlines associated with a set of RRAM 708 or set of RRAM 710, whereas the bias voltage can improve operation of read transistor 714.

In at least one aspect of the subject disclosure, SLDEC 718 can be configured to activate or deactivate $WL_0$, as well as activate or deactivate reference transistors (e.g., reference transistor 716) associated with $WL_0$. SLDEC 718 can be further configured to control a level of the bias voltage applied to the gate of read transistor 714, through a source line $SL_0$ connected to a channel region of reference transistor 716. Additionally, reference transistor 716 and SLDEC 718 can operate as a current source at a suitable level proportional to an off current of RRAM 708, 710, and can be configured to pre-charge the gate of read transistor 714, as described herein.

Electronic memory 700 provides even greater component density than electronic memory 600 of FIG. 6, supra. As depicted, each read transistor 714 can be connected to at least six RRAM devices. It should be appreciated, however, that more than six RRAM devices can be connected to a single read transistor, in alternative embodiments. For instance, more than two sets of RRAM 708, 710 can be connected to read transistor 714 within memory $block_0$ 702. As another example, respective sets of RRAM can include more than three RRAM devices, by incorporating more than three bitlines per set of bitlines per memory block. The high component density of electronic memory 700 or similar embodiments can provide very high memory density, essentially organizing a large number of memory cells within a given amount of silicon space. This architecture can help to further one goal of modern electronic memory, increasing memory capacity of memory chips.

FIG. 8 illustrates a diagram of an example operating table 800 for electronic memory 700 of FIG. 7, in one or more aspects of the subject disclosure. Operating table 800 illustrates example operating voltages for respective signal lines, including bitlines, wordlines, select lines and source lines of electronic memory 700. It should be appreciated, however, that these example operating voltages are not exclusive, and other operating signals and operating voltage levels can be applicable for electronic memory 700 or similar embodiments thereof.

As depicted, operating table 800 includes, on the left side, a read operation, a page erase operation, and a program operation. Each operation comprises two processes, a pre-charge process and a read or execute process. Various shaded regions of operating table 800 highlight a signal change to a particular signal line of electronic memory 700 to implement the respective operation. To read an RRAM device connected to $BL_2$ of $WL_1$, for instance, a change in input signal is applied to five signal lines of electronic memory 700 for pre-charging and sensing of the RRAM device. Likewise, for page erase and program operations, a pre-charge stage is performed and then erase or program is executed with a change in input signal applied to two signal lines, respectively.

Referring to a read operation targeting an RRAM device connected to $BL_2$ of $WL_1$ of electronic memory 700, the pre-charge process comprising raising $WL_1$ to a supply voltage $V_{dd}$, applying 0.5 volts to $BL_2$ of $block_0$ and $BL_2$ of $block_1$, applying 0.5 volts to control line $SL_0$, and applying $V_{dd}$ to $V_{BIAS}$ thereby activating reference transistor 716. The sensing process, to determine a state of the RRAM device, comprising lowering $WL_1$ to 0 volts, applying 1 volt to $BL_2$ of $block_0$ and to $BL_2$ of $block_1$, applying 0 volts to $SL_0$ and applying a reference voltage $v_{ref}$ to $V_{BIAS}$.

Referring to the page erase operation, a pre-charge process comprises applying 0 volts to $SL_0$ and 4 volts to $V_{BIAS}$. An execution process to perform the page erase comprises raising the voltage at $SL_0$ from 0 volts to 3 volts, and maintaining 4 volts at $V_{BIAS}$. This operation will pass the 3 volts to the lower terminal of the RRAM cells and erase all RRAM on the selected $WL_0$ row.

Referring to a program operation targeting two RRAM devices concurrently, the program pre-charge and execute operations affect RRAM devices connected to $BL_2$ of $WL_0$ of $block_0$ and $BL_2$ of $WL_0$ of $block_1$ of electronic memory 700. The pre-charge process can comprise applying the supply voltage $V_{dd}$ to $WL_1$, applying 3 volts to $BL_2$ of $block_0$ and 3 volts to $BL_2$ of $block_1$, and applying 3 volts to $SL_0$. To execute the programming, an execute process can be performed comprising lowering $SL_0$ to 0 volts, lowering $WL_1$ from $V_{dd}$ to 0 volts and setting $BL_0$ and $BL_1$ of $block_0$ to 1.5 volts to inhibit programming on $WL_1$ and bitlines $BL_0$ and $BL_1$, respectively, and maintaining $WL_0$ at $V_{dd}$ and $BL_2$ at 3 volts to program the RRAM device at $BL_2$ and $WL_0$ of $block_0$.

The aforementioned diagrams have been described with respect to interaction between several components, or memory architectures. It should be appreciated that such diagrams can include those components and architectures specified therein, some of the specified components/architectures, and/or additional components/architectures. For example, a memory cell architecture could include a combination of electronic memory 400 and electronic memory 300. Sub-components could also be implemented as electrically connected to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. In addition, it should be appreciated that respective rows of disclosed memory architectures can be erased in groups (e.g., multiple rows erased concurrently) or individually. Moreover, it should be appreciated that multiple RRAM cells on a particular row can be programmed in groups (e.g., multiple RRAM cells programmed concurrently) or individually. Components of the disclosed architectures can also interact with one or more other components not specifically described herein but known by those of skill in the art.

Figure 9:
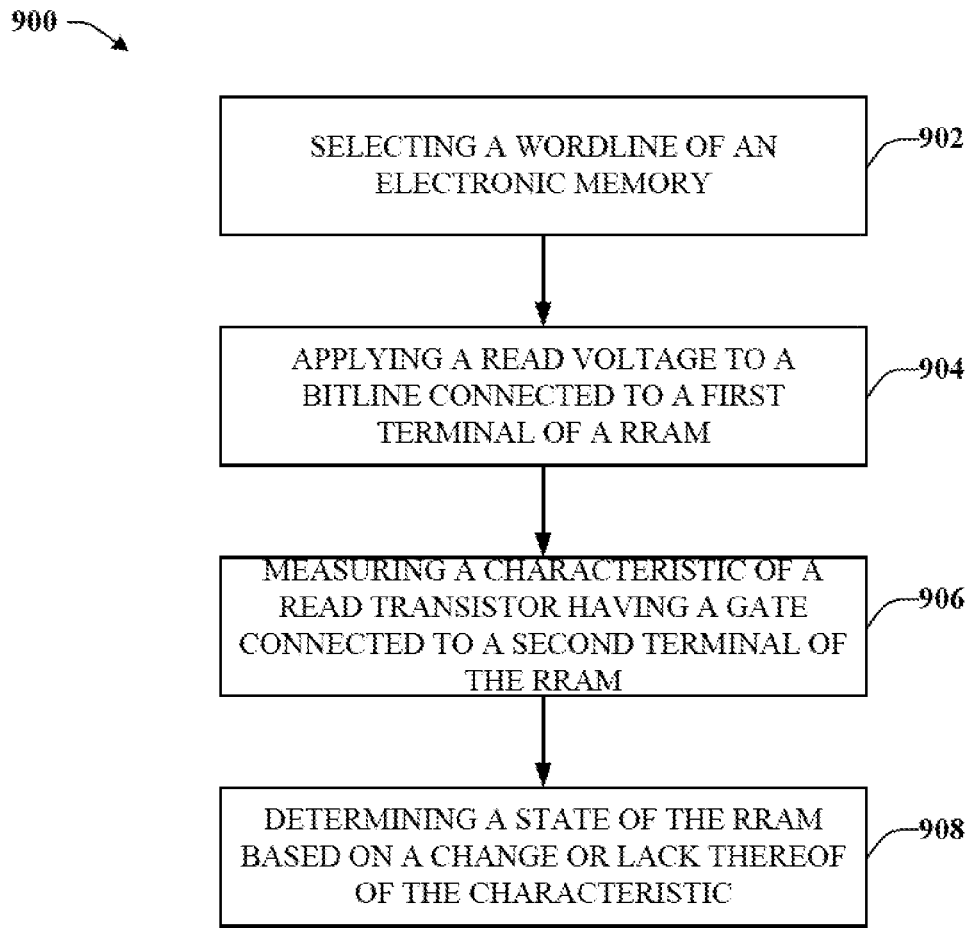
FIG. 9 depicts a flowchart of a sample method for providing high speed RRAM according to further aspects.
Figure 10:
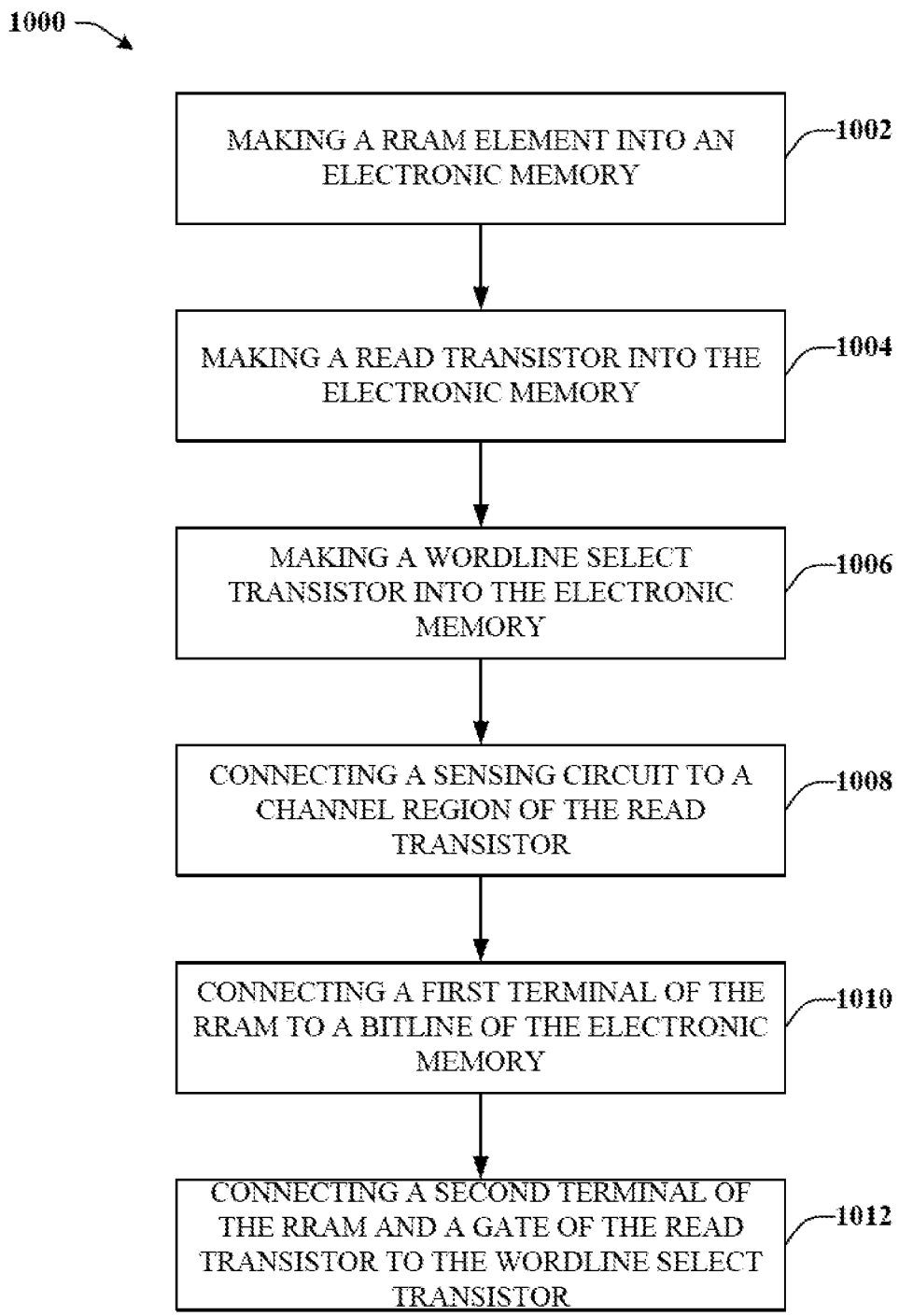
FIG. 10 depicts a flowchart of an example method for fabricating high speed RRAM according to still other aspects.

In view of the exemplary diagrams described supra, process methods that can be implemented in accordance with the disclosed subject matter will be better appreciated with reference to the flow charts of FIGS. 9 and 10. While for purposes of simplicity of explanation, the methods 900, 1000 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods 900, 1000 described hereinafter. Additionally, it should be further appreciated that the methods 900, 1000 disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 9 illustrates a flowchart of an example method 900 for providing high speed RRAM according to one or more aspects of the subject disclosure. At 902, method 900 can comprise selecting a wordline of an electronic memory device. Selecting the wordline can comprise, for instance, applying a suitable activation signal to the wordline. Selecting the wordline can additionally comprise inhibiting activation of other wordlines of the electronic memory device by refraining from applying the activation signal to other wordlines, allowing the other wordlines to float (e.g., in the event of a non-linear resistance RRAM), or applying an inhibiting voltage to the other wordlines, or the like. At 904, method 900 can comprise applying a read voltage to a bitline connected to a first terminal of a RRAM device. At 906, method 900 can comprise measuring an electrical characteristic of a read transistor having a gate connected to a second terminal of the RRAM. The electrical characteristic can be a voltage characteristic, a current characteristic, or the like. Additionally, at 908, method 900 can comprise determining a state of the RRAM based on a change or lack thereof of the electrical characteristic. For instance, where a change in the electrical characteristic corresponds with an active, or program state of the RRAM, determining the state can comprise determining the RRAM is in a programmed state. Likewise, where a lack of change in the electrical characteristic corresponds with a deactivated, or erased state of the RRAM, determining the state can comprise determining the RRAM is in an erased state. According to particular aspects of the subject disclosure, method 900 can further comprise measuring the electrical characteristic for a duration that is proportional to a capacitance of the gate of the read transistor multiplied by a resistance of the RRAM when the RRAM is activate. In alternate or additional aspects, method 900 can further comprise activating a select transistor to connect one subset of RRAM, of which the RRAM is a member, to the gate of the read transistor, and deactivating or leaving deactivated a second select transistor to isolate a second subset of RRAM from the gate of the read transistor. In at least one additional aspect, method 900 can additionally comprise applying a bias voltage to the gate of the read transistor, wherein the bias voltage is close to be less than a threshold voltage of the read transistor. In yet other aspects, method 900 can comprise pre-charging the RRAM device or a set of RRAM devices in conjunction with (or, e.g., prior to) operating on the RRAM device(s), including performing a read operation, a write operation, or a program operation on the RRAM device(s).

FIG. 10 illustrates a flowchart of a sample method 1000 for fabricating high read speed RRAM for an electronic memory device, according to still other aspects of the subject disclosure. At 1002, method 1000 can comprise making a resistive RRAM element into the electronic memory device. At 1004, method 1000 can comprise making a read transistor into the electronic memory device, and at 1006, method 1000 can comprise making a wordline select transistor into the electronic memory. At 1008, method 1000 can comprise connecting a sensing circuit to a channel region of the read transistor. At 1010, method 1000 can comprise connecting a first terminal of the RRAM element to a bitline of the electronic memory. Particularly, the bitline of the electronic memory can be a sensing bitline that is not connected to operating bitlines (e.g. columns) of the electronic memory device that are utilized to operate on the memory cells (e.g., program, erase, read, . . . ). At 1012, method 1000 can comprise connecting a second terminal of the RRAM element and a gate of the read transistor to opposite channel region terminals (e.g. a source terminal and a drain terminal, respectively) of the wordline select transistor.

Figure 11:
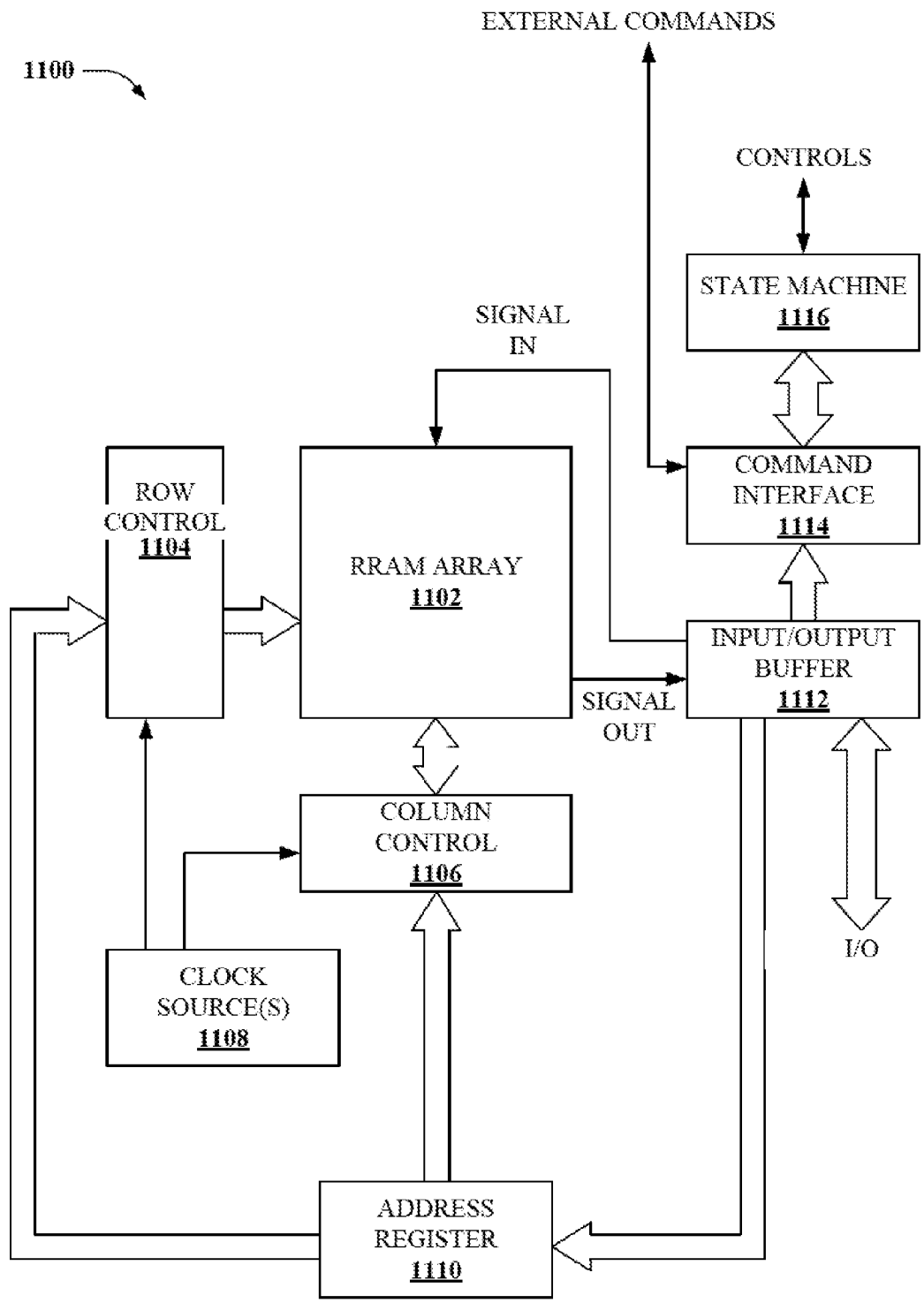
FIG. 11 illustrates a block diagram of an example electronic operating environment according to one or more additional aspects of the subject disclosure.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 11 illustrates a block diagram of an example operating and control environment 1100 for a RRAM array 1102 according to aspects of the subject disclosure. In at least one aspect of the subject disclosure, RRAM array 1102 can comprise a variety of RRAM memory cell technology. Particularly, RRAM array can be arranged to provide high read speed operation, in conjunction with high program and erase speeds of RRAM cells, as described herein.

A column controller 1106 can be formed adjacent to RRAM array 1102. Moreover, column controller 1106 can be electrically coupled with bit lines of RRAM array 1102. Column controller 1106 can control respective bitlines, applying suitable program, erase or read voltages to selected bitlines.

In addition, operating and control environment 1100 can comprise a row controller 1104. Row controller 1104 can be formed adjacent to column controller 1106, and electrically connected with word lines of RRAM array 1102. Row controller 1104 can select particular rows of memory cells with a suitable selection voltage. Moreover, row controller 1104 can facilitate program, erase or read operations by applying suitable voltages at selected word lines.

A clock source(s) 1108 can provide respective clock pulses to facilitate timing for read, write, and program operations of row control 1104 and column control 1106. Clock source(s) 1108 can further facilitate selection of word lines or bit lines in response to external or internal commands received by operating and control environment 1100. An input/output buffer 1112 can be connected to an external host apparatus, such as a computer or other processing device (not depicted) by way of an I/O buffer or other I/O communication interface. Input/output buffer 1112 can be configured to receive write data, receive an erase instruction, output readout data, and receive address data and command data, as well as address data for respective instructions. Address data can be transferred to row controller 1104 and column controller 1106 by an address register 1110. In addition, input data is transmitted to RRAM array 1102 via signal input lines, and output data is received from RRAM array 1102 via signal output lines. Input data can be received from the host apparatus, and output data can be delivered to the host apparatus via the I/O buffer.

Commands received from the host apparatus can be provided to a command interface 1114. Command interface 1114 can be configured to receive external control signals from the host apparatus, and determine whether data input to the input/output buffer 1112 is write data, a command, or an address. Input commands can be transferred to a state machine 1116.

State machine 1116 can be configured to manage programming and reprogramming of RRAM array 1102. State machine 1116 receives commands from the host apparatus via input/output interface 1112 and command interface 1114, and manages read, write, erase, data input, data output, and like functionality associated with RRAM array 1102. In some aspects, state machine 1116 can send and receive acknowledgments and negative acknowledgments regarding successful receipt or execution of various commands.

To implement read, write, erase, input, output, etc., functionality, state machine 1116 can control clock source(s) 1108. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An electronic memory, comprising:
 a resistive random access memory (RRAM) connected at a first RRAM terminal to a bitline of the electronic memory;
 a read transistor have a gate connected to a second RRAM terminal of the RRAM; and
 a sensing circuit connected to a channel region of the read transistor via a sensing bitline; wherein:
   the sensing circuit determines a state of the RRAM from a characteristic of the channel region in response to a transient read signal applied through the bitline to the first RRAM terminal.

2. The electronic memory of claim 1, further comprising a reference transistor that passes an initial voltage to the gate of the read transistor, the initial voltage being smaller than a threshold voltage of the read transistor.

3. The electronic memory of claim 2, wherein the reference transistor operates as a current source in conjunction with reading a state of the RRAM.

4. The electronic memory of claim 2, wherein the RRAM is a non-linear resistance RRAM that permits current to flow in a single direction in response to the read signal.

5. The electronic memory of claim 2, further comprising a word line select transistor, wherein the reference transistor and the word line select transistor can be configured to apply a pre-charge voltage to the second RRAM terminal, wherein the pre-charge voltage counterbalances a bitline pre-charge voltage.

6. The electronic memory of claim 2, further comprising a source line decoder configured to program the reference transistor to apply the initial voltage.

7. The electronic memory of claim 6, wherein the RRAM and read transistor are connected to one of a plurality of wordlines of the electronic memory, and wherein the source line decoder is further configured to activate the one of the plurality of wordlines for reading by applying a predetermined voltage to the one of the plurality of wordlines.

8. The electronic memory of claim 6, further comprising a pre-charge transistor electrically connected to the second RRAM terminal and electrically connected to the source line decoder via a source line, wherein activating the pre-charge transistor facilitates passing a pre-charge voltage from the source line decoder to the second RRAM terminal.

9. The electronic memory of claim 1, wherein a gate capacitance of the gate of the read transistor is small relative to a bitline capacitance of the bitline.

10. The electronic memory of claim 1, wherein the sensing bitline is decoupled from a stimulus input of the electronic memory.

11. The electronic memory of claim 1, wherein the RRAM is a member of a first set of RRAM that are connected to or isolated from the read transistor by a first select transistor that is activated by a first select line.

12. The electronic memory of claim 11, wherein the bitline is a member of a first set of bitlines connected respectively to one of the set of RRAM, and wherein the signal is applied to one of the set of bitlines to read a respective one of the set of RRAM.

13. The electronic memory of claim 11, further comprising a second set of RRAM that are connected to or isolated from the read transistor by a second select transistor that is activated by a second select line.

14. The electronic memory of claim 13, wherein the first set of RRAM or the second set of RRAM is electrically connected to the gate of the read transistor by activation of the first select transistor or the second select transistor, respectively.

15. The electronic memory of claim 13, comprising a plurality of the first set of RRAM and a plurality of the second set of RRAM connected respectively to one of a plurality of read transistors on a wordline of the electronic memory.

16. The electronic memory of claim 13, comprising a plurality of the first set of RRAM and a plurality of the second set of RRAM connected to one of a plurality of read transistors on respective ones of a plurality of sets of bitlines and respective ones of a plurality of sets of first and second select transistors.

17. A method of operating electronic memory, comprising:
 selecting a wordline of the electronic memory;
 applying a transient read voltage to a bitline that is connected to a first terminal of a resistive random access memory (RRAM);
 measuring an electrical characteristic of a read transistor having a gate connected to a second terminal of the RRAM through a sensing bitline that is decoupled from a stimulus source operating RRAM cells of the electronic memory; and
 determining a state of the RRAM based on a change or lack of change of the electrical characteristic.

18. The method of claim 17, further comprising measuring the electrical characteristic for a duration that is proportional to a gate capacitance of the gate of the read transistor multiplied by a resistance of the RRAM when the RRAM is in a conductive mode.

19. The method of claim 17, further comprising pre-charging the gate of the read transistor with a bias voltage to facilitate enhancing the response of the read transistor.

* * * * *

UNITED STATES PATENT AND TRADEMARK OFFICE
CERTIFICATE OF CORRECTION

Page 1 of 1

PATENT NO. : 8,619,459 B1
APPLICATION NO. : 13/481696
DATED : December 31, 2013
INVENTOR(S) : Sang Nguyen and Hagop Nazarian It is certified that error appears in the above-identified patent and that said Letters Patent is hereby corrected as shown below:

Column 1, lines 9-10 Related U.S. Application Data (Paragraph 1 of the Specification): Please change Application Number 61/500,574 filed August 6, 2011 to -- Application Number 61/500,547 filed June 23, 2011 --

Signed and Sealed this
Twenty-second Day of December, 2015

Michelle K. Lee
*Director of the United States Patent and Trademark Office*